Nov. 16, 1965 H. P. SCHMIDT 3,217,644

CLAMPING MEANS FOR MOUNTING CARRIER SHEETS ON FLAT OR ROUND SURFACES

Filed March 30, 1962 2 Sheets-Sheet 1

INVENTOR.
HARRY P. SCHMIDT

BY Percy Freeman

ATTORNEYS

Nov. 16, 1965 H. P. SCHMIDT 3,217,644
CLAMPING MEANS FOR MOUNTING CARRIER SHEETS ON FLAT OR ROUND SURFACES
Filed March 30, 1962 2 Sheets-Sheet 2

INVENTOR.
HARRY P. SCHMIDT
BY
Percy Freeman
ATTORNEYS

United States Patent Office 3,217,644

Patented Nov. 16, 1965

3,217,644

CLAMPING MEANS FOR MOUNTING CARRIER SHEETS ON FLAT OR ROUND SURFACES

Harry P. Schmidt, Jackson Heights, N.Y., assignor to Mosstype Corporation, Waldwick, N.J., a corporation of New York Filed Mar. 30, 1962, Ser. No. 183,821
3 Claims. (Cl. 101—415.1)

This invention relates generally to printing equipment, and is especially concerned with structure for mounting flexible printing plates or saddles upon rotary or flat-bed presses.

The advantage of flexible printing plates, including the ease of handling and storage, relative economy, and other advantageous features are well known. However, flexible printing plates have heretofore been relatively difficult to mount in accurate registry, especially in remounting for rerunning. Also, the mounting of flexible printing plates has heretofore involved tedious and costly make-ready (which is the shimming necessary to insure accurate kissing of the plate with the work).

Accordingly, it is a general object of the present invention to provide improvements in the mounting of flexible printing plates which greatly simplifies, speeds and facilitates the mounting of such plates on a printing press in accurate register, and wherein make-ready is extremely simple and easy.

Another disadvantage in prior constructions for mounting flexible printing plates was the necessity for an opening or gap at the location of securement to the roll or base. Such opening or gap precluded the positioning of print over the gap, thereby limiting layout and design; and also, such a gap is likely to collect dust, dirt, ink and the like so as to adversely affect the plate-mounting operation as well as quality of the work.

Other objects of the present invention will become apparent upon reading the following specification and referring to the accompanying drawings, which form a material part of this disclosure.

The invention accordingly consists in the features of construction, combinations of elements, and arrangements of parts, which will be exemplified in the construction hereinafter described, and of which the scope will be indicated by the appended claims.

Figure 1:
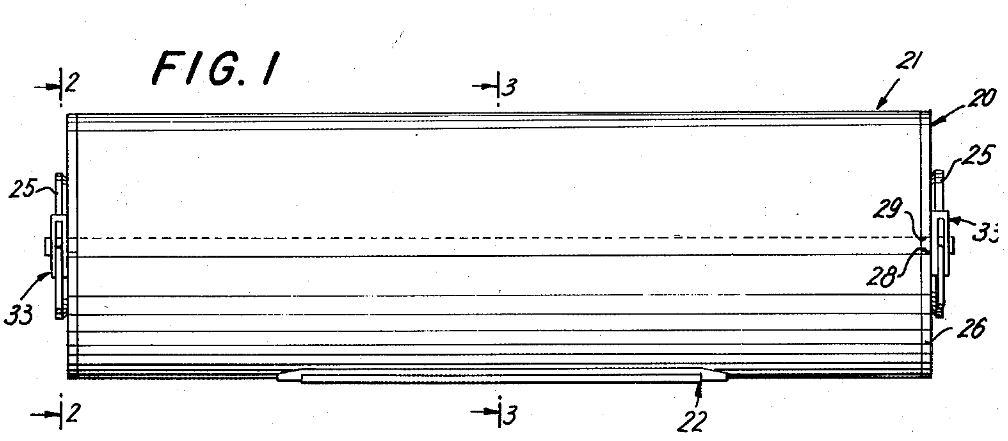
FIG. 1 is a plan view showing a printing-press roll of the present invention having a flexible printing plate mounted thereon.
Figure 2:
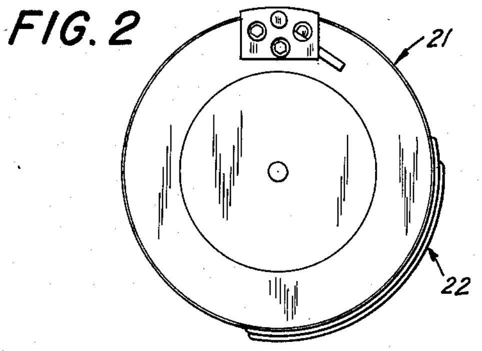
FIG. 2 is an end view taken substantially along the line 2—2 of FIG. 1.
Figure 3:
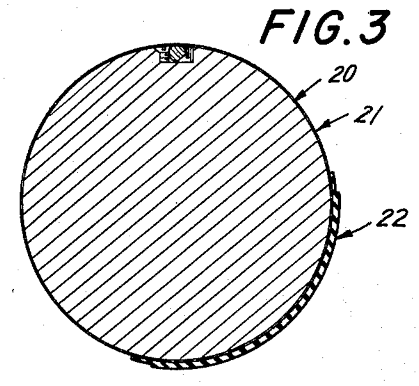
FIG. 3 is a transverse sectional view taken substantially along the line 3—3 of FIG. 1.
Figure 4:
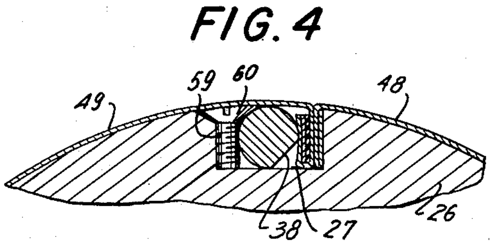
FIG. 4 is a fragmentary sectional view similar to FIG. 3, but enlarged for clarity.

Referring now more particularly to the drawings, and specifically to FIGS. 1–7 thereof, there are illustrated therein a generally cylindrical plate support or roll 20 adapted to be rotatably mounted in a rotary printing press. Removably carried by the roll 20 is a carrier sheet 21. The carrier sheet 21 is engaged about the roll 20 and carries on its front or outer surface a flexible printing plate 22, as of rubber or other suitable material.

The roll or support 20 may have its opposite ends provided with generally central mounting formations 25 of any suitable configuration. Of generally cylindrical configuration is the peripheral roll surface 26, which is adapted for supporting, facing engagement with the inner surface or back 45 of the carrier sheet 21. The cylindrical roll 20 is further provided on its peripheral surface with an elongate recess 27. That is, the recess 27 is elongate longitudinally of the roll 20 and opens radially outward therefrom through the cylindrical surface 26. The recess 27 may be of generally rectangular, substantially constant cross-sectional configuration throughout its length, which length may be coextensive with the roll 20. The recess 27 thereby defines an open-ended groove, opening through opposite ends of the roll 20, and may be provided with a pair of spaced, facing internal side walls 28 and 29, which intersect with the cylindrical supporting surface 26. That is, the recess side wall 28 intersects at a relatively sharp angle with the supporting surface 26 along the longitudinally extending meeting edge or corner 30, see FIG. 5, while the other recess side wall 29 similarly intersects at a sharp angle with the peripheral supporting surface 26 along a meeting edge 31, see FIG. 7.

Secured on each end of the roll 20 are journal blocks 33. The journal blocks 33 may be substantially identical to each other, but of opposite hand, each block being secured fast to the adjacent end of roll 20, as by fasteners 34. A cutout or slot 35 is formed in each block 33 along a plane generally perpendicular to the axis of the roll 30 and opening radially outward therefrom.

Extending longitudinally of and received within the recess 27 is an elongate cam 37, which may be of generally cylindrical, rod-like configuration, and provided with a longitudinally extending flat 38. The elongate, rod-like cam 37 has its opposite end regions 39 extending rotatably through respective blocks 33, to thereby turnably or rotatably mount the cam for generally axial rotation within the recess 27. A manually actuable member or arm 40 may extend radially from each journaled cam end region 39 within the adjacent cutout or slot 35 for swinging movement therein upon rotation of the cam 37. The actuating members or arms 40 project from their respective slots 35 beyond the blocks 33 for convenient manual operation.

Figure 5:
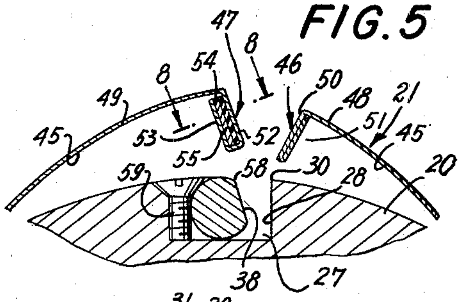
FIG. 5 is a fragmentary sectional view similar to FIG. 4, but showing a printing-plate carrier sheet in an intermediate condition of mounting or removal.
Figure 6:
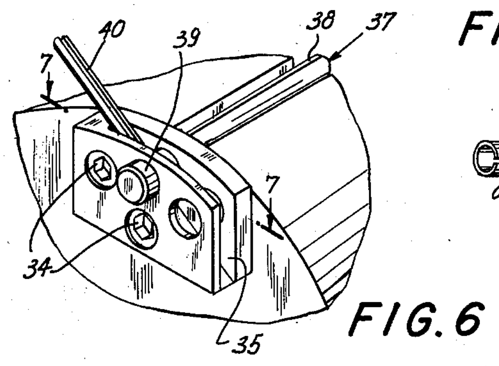
FIG. 6 is a fragmentary perspective view showing a printing-press roll constructed in accordance with the teachings of the present invention.
Figure 7:
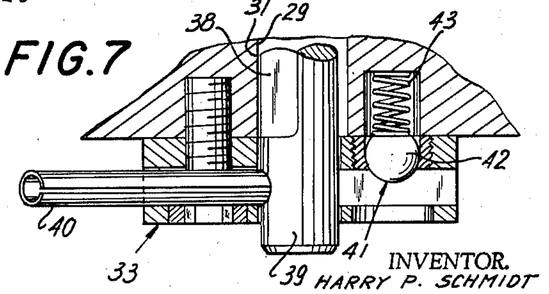
FIG. 7 is a sectional view taken substantially along the line 7—7 of FIG. 6.

As illustrated in FIGS. 5–7, the cam 37 is in its inoperative, or releasing condition, and the arms 40 are swingable generally clockwise to move the cam to its operative or clamping condition, as shown in FIGS. 1–4. In this condition, the arms 40 are held against return movement by suitable releasable detent means 41, best seen in FIG. 7. That is, the detent means may include a ball 42 resiliently biased by a spring 43 to a position extending across the path of movement of the arm 40 to its clamping position. Of course, the ball 42 is resiliently yieldably displaceable out of the path of movement of the arm 40 upon deliberate operation of the latter, but serves to effectively prevent inadvertent return of the arm from its clamping position.

The carrier sheet 21 may be fabricated of resiliently flexible, thin sheet metal, or other satisfactory material, and may be wrapped partially or entirely about the roll 20 with the inner or back surface 45 of the sheet in facing engagement with the supporting roll surface 26. The carrier sheet 21 may be of generally rectangular configuration, having its lateral extent or width equal to or less than the longitudinal extent or length of the roll 20. On respective opposite ends of the carrier sheet 21, preferably laterally coextensive with the carrier sheet are transverse extensions or lips 46 and 47. The lips 46 and 47 each extend relatively rigidly from and substantially normal to their respective adjacent end regions 48 and 49 of the carrier sheet 21, and may advantageously be formed as integral extensions thereof. As illustrated, the lip 46 may include an integral extension or flange 50 on the carrier-sheet end region 48, and a terminal portion 51 integral with the distal edge of the flange and reversely bent into facing engagement therewith, to effectively reinforce and rigidify the lip.

The lip 47 may similarly include a flange 52 extending integrally from the carrier-sheet end region 49, and a reversely bent extension 53 on the outer edge of the flange lying in facing relation with the latter. A reinforcing member or bar 54 may be interposed between the flange 52 and terminal portion 53, and a resiliently deformable elongate member or strip 55, say of rubber or other similarly resiliently deformable material, is interposed in sandwiched relation between the reinforcing layer or bar 54 and flange 52.

Figure 8:
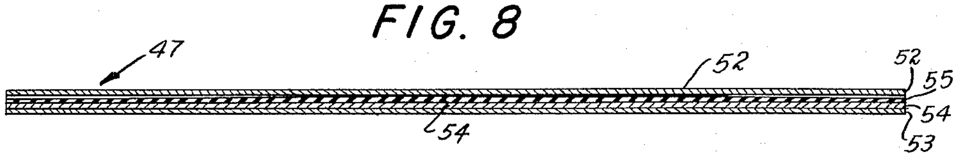
FIG. 8 is a sectional view taken substantially along the line 8—8 of FIG. 5.
Figure 9:
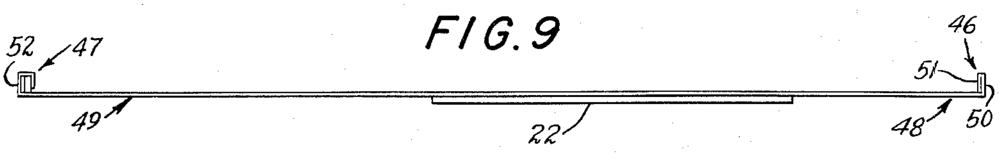
FIG. 9 is a longitudinal edge view of a carrier sheet and printing plate of the present invention.

As best seen in FIG. 8, the resiliently deformable member 55 is advantageously of a thickness in the direction between the flange 47 and reinforcing layer 54 which decreases from the longitudinally medial region outward toward opposite ends.

Figure 10:
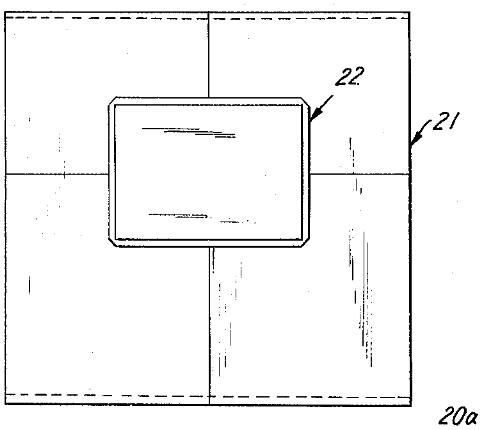
FIG. 10 is a front view of the carrier sheet and plate of FIG. 9.

The flexible printing plate 22 is shown as located centrally between the ends and side edges of the carrier sheet 21, see FIG. 10. However, the printing plate may assume any desired location on the carrier sheet, and may even extend up to and terminate at the carrier sheet ends, if desired.

In mounting of the carrier sheet 21 on the roll 20, the sheet is wrapped about the roll, and the lip 46 engaged in the recess 27 bearing against the side wall 28. The intersection line 30, as defined by the contiguous relation of recess 27 and supporting surface 26, engages conformably in the corner defined by the carrier-sheet end portion 48 and lip 46 to effectively locate and accurately position the carrier sheet on the supporting surface 26.

The carrier-sheet lip 47 is also extended into the recess 27, between the lip 46 and cam 37. In this condition, the carrier-sheet end region extends across and overlies the recess 27, substantially coplanar with the supporting surface 26, such that the opposite end regions 48, 49 of the carrier sheet are substantially flush and meet in tight-fitting engagement.

To insure maintenance of this mounted condition of the carrier sheet 21 on the roll 20, the cam 37 is rotated, as by actuation of the arms 40 to engage the extension 53 of the lip 47, thereby clamping the lip 47 against the lip 46, and clamping the latter lip against the recess side wall 28. In particular, the flat formation 38 of the cam 37 defines an engaging lobe portion or edge 58 which engages against the lip 47 to effect the above-described clamping action.

To prevent possible bowing of the elongate cam 37, one or more steadying members 59 may be located along the recess side wall 29 to resist any bowing action of the cam. As shown, the steadying member 59 may be a headed fastener or screw threadedly engaged in the roll 20 and located to bear against the cam 37 on the side remote from recess wall 28. Further, the head 60 of steadying member 59 may engage partially over the cam 37 and be of generally conical shape such that the steadying member may be rotated to adjust the same inward and outward of the roll 20 to compensate for wear and insure firm supporting engagement at all times with the cam.

As bowing of the cam 37 is thereby prevented or limited, and as the resiliently deformable sandwiched layer 55 is thicker in its medial region, it will be understood that the medial region of the lip 47, and specifically of the extension layer 53 is initially engaged by the engaging portion 58 of cam 37, and that engagement of the lip proceeds toward the ends thereof upon continued rotation of the cam to its clamping position. This insures smooth spreading of the lips 46 and 47 under the clamping action of cam 37. Of course, upon rotation of the cam 37 from its clamping position of FIGS. 1–4, to its releasing position of FIGS. 5–7, the lips 46 and 47 are released for withdrawal from the recess 27, and the carrier sheet may be removed.

Figure 11:
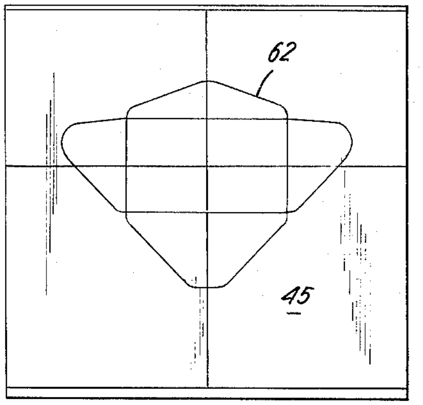
FIG. 11 is a rear view of the carrier sheet and plate of FIG. 9.

In FIG. 10 is shown the printing plate 22 on the front surface of the carrier sheet 21, while FIG. 11 shows the rear surface 45 of the carrier sheet, and illustrates a registration pattern 62 (in this instance, of an envelope which is to be printed) in registry with the printing plate 22. The pattern 62 may be marked by any suitable means, as by scribing, printing or the like, and provides the highly advantageous result of permitting quick and easy make-ready. That is, a low spot of the printing plate 22, as evidenced by lack of kissing the work, may be quickly and accurately located by means of the markings 62, so that a shim of paper or the like may be interposed between the carrier sheet 21 and supporting surface 26 in proper location to correct the kissing action.

Figures 12, 13, 14, 15:
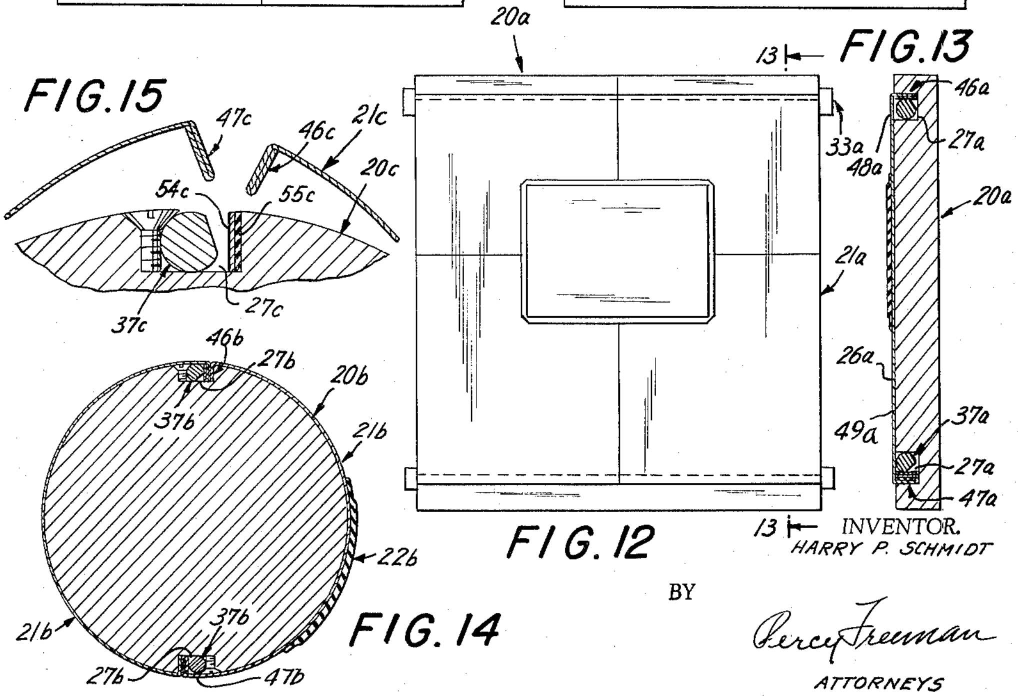
FIG. 12 is a front elevational view showing a printing-plate base of a flat-bed printing machine and printing plate mounted thereon in accordance with the instant invention.
FIG. 13 is a sectional view taken substantially along the line 13—13 of FIG. 12.
FIG. 14 is a transverse sectional view similar to FIG. 3, but showing a slightly modified embodiment of the instant invention.
FIG. 15 is a view similar to FIG. 5, but showing another embodiment of the invention.

In the embodiment of FIGS. 12 and 13, the instant invention is illustrated as applied to a generally flat support member or plate **20*a* for a flat-bed printing press. In this embodiment, the support 20*a* has a substantially flat supporting surface 26*a* for supporting a carrier sheet 21*a*, which may be identical to the carrier sheet 21. However, the support or base 20*a* is preferably provided with a pair of spaced, elongate recesses or grooves 27*a* each containing a clamping member or cam 37*a* rotatably supported by suitable journal blocks 33*a***.

Thus, the recesses **27*a* are each located contiguous to the supporting surface 26*a*, and the carrier sheet 21*a* is in facing engagement with the supporting surface 26*a*, extending between the recesses 27*a*. Further, the end regions 48*a* and 49*a* of the carrier sheet 21*a* extend across or overlie their adjacent recesses, and are provided with transversely projecting lips 46*a* and 47*a* respectively entering and removably clamped in the adjacent recesses. Here again, the recesses 27*a* are effectively closed by the overlying relation of the carrier-sheet end regions 48*a* and 49*a*, while the carrier sheet is precisely located for accurate registry by the clamping engagement of the lips 46*a* and 47*a*** against the recess side walls.

An additional embodiment is shown in FIG. 14, a generally cylindrical support member or roll **20*b* being there provided with a plurality of longitudinally extending, radially outwardly opening recesses or grooves 27*b*, each having mounted therein a rotatable clamping cam 37*b***.

In this embodiment, plural carrier sheets **21*b* may extend in end-to-end relation about the circumference of roll 20*b*, with the lips 46*b* and 47*b* of successive carrier sheets entering into and clamped in the same recess. While only a single printing plate 22*b* is shown on one of the carrier sheets 21*b*, it is believed apparent that the other carrier sheet may also be provided with a printing plate, if desired, and that the plates of the several sheets will be in proper registry by reason of the accurately located and clamped lips. Also, the several carrier sheets 21*b*** may have printing plates in contiguous relation with each other at their meeting ends, if desired.

In addition, several carrier sheets may be mounted in side by side relation on a single support, either cylindrical or flat.

In FIG. 15, a roll 20c is shown as provided with a longitudinally extending, outwardly facing recess 27c having a clamping member or cam 37c turnably mounted therein. However, in this embodiment, a resiliently deformable strip or layer 55c is secured in the recess 27c, as by a covering strip or layer 54c, with the latter facing toward the cam 37c.

By this construction, the carrier sheet 21c may have its end lips 46c and 47c substantially identical, as by integral extensions of the carrier sheet and without the interposition of a resiliently deformable layer in one of the lips. The lips 46c and 47c are thereby engageable in the recess 27c and clamped therein upon rotation of the cam 37c with the layer 55c being yieldably deformed to insure proper clamping and tight engagement of the carrier-sheet ends. If desired, the yieldably deformable member 55c may be of decreasing thickness toward its opposite ends for outwardly spreading engagement of the cam 37c in the manner of member 55.

From the foregoing, it is seen that the present invention provides a highly improved printing apparatus which fully accomplishes its intended objects and is well adapted to meet practical conditions of manufacture and use.

Although the present invention has been described in some detail by way of illustration and example for purposes of clarity of understanding, it is understood that certain changes and modifications may be made within the spirit of the invention and scope of the appended claims.

What is claimed is:

1. In printing apparatus, the combination comprising a support having a supporting surface, said support being provided with a recess contiguous to said supporting surface and having side walls intersecting said supporting surface, a flexible carrier sheet removably engaged in facing relation with said supporting surface and having a first transverse lip on one end of said sheet, removably extending into said recess and against one wall thereof, a second transverse lip on the other end of said sheet entering into said recess against said first lip, with a transverse end of the sheet which adjoins said second lip extending across said recess; and clamping means in said recess releasably clamping said lips in said recess, said clamping means comprising a rotatable cam in said recess and having an engaging portion movable into and out of engagement with said second lip to effect clamping and release of both said lips, said recess being of elongate configuration, said cam being of elongate configuration within said recess and having its engaging portion extending longitudinally of said cam, and said second lip being of elongate configuration extending along said other end of said sheet, for clamping engagement of said engaging portion entirely along said second lip, said second lip comprising a flange on said other end of said sheet extending longitudinally therealong, a resiliently deformable layer on said flange extending longitudinally thereof, and an additional layer on said resiliently deformable layer extending longitudinally thereof and combining with said flange to sandwich therebetween said resiliently deformable layer, said sandwiched layer being of decreasing dimension between said flange and additional layer from its medial region toward its opposite ends, whereby engagement of said engaging portion with said second lip proceeds from the medial region thereof laterally outward toward its opposite ends.

2. A printing apparatus comprising a cylindrical supporting surface having a longitudinal groove extending inwardly from said surface, an elongate cam of generally cylindrical rod-like configuration and having a longitudinally extending flat, mounted for axial rotation within said groove, between an inactive and an active position, with its cylindrical surface tangent to the development of the cylindrical supporting surface across said groove opening, its axial center being nearer to one side wall of said groove than to the other, said cam defining a clamping means, a carrier sheet of generally rectangular configuration of resiliently flexible material, a transverse extension or lip on each end of said carrier sheet extending rigidly downward from said carrier sheet, said lips being compressible, the distance between the lips being such that the carrier sheet will completely, smoothly, and perfectly lay onto the cylindrical supporting surface so that the lips will precisely fit into the space between said flat and the adjacent wall of said groove when said cam is in inactive position and allow for the cam to squeeze or compress the lips to securely, though releasably, clamp the sheet in place with a continuous smooth outer cylindrical surface to receive printing plates, means for rotating said cam into compressing relation with the adjacent one of said lips to compress both said lips into intimate contact and against the wall of said groove, whereby the outer surface of the carrier sheet defines a substantially continuous cylindrical surface.

3. A printing apparatus comprising a support having a supporting surface and a recess opening to said supporting surface, a flexible carrier sheet removably engaged in facing relation with said supporting surface, a first lip on one end of said sheet removably engaged in said recess and against one wall thereof, the other end of said sheet having a region parallel with said one end overlying said recess and terminating in a second lip which, at the time of installation, removably extends into said recess in abutting face-to-face relation with said first lip, a cam in said recess underlying said sheet region with a portion of its longitudinal surface tangent to a development of the supporting surface across said recess, said cam being rotatable only into and out of clamping engagement with said lips, and resiliently compressible means between said wall and said first lip.

References Cited by the Examiner

UNITED STATES PATENTS

| | | | |
|---|---|---|---|
| 2,048,631 | 7/1936 | Motson | 101—395 |
| 2,051,858 | 8/1936 | Huck | 101—415.1 |
| 2,099,969 | 11/1937 | Berman | 51—176 |
| 2,157,621 | 5/1939 | Neilson | 101—415.1 |
| 2,249,938 | 7/1941 | Bomberger et al. | 101—415.1 |
| 2,279,204 | 4/1942 | Neilson | 101—415.1 |
| 2,375,603 | 5/1945 | Willard | 101—415.1 |
| 2,424,167 | 7/1947 | Hillquist | 51—194 |
| 2,550,749 | 5/1951 | Zwoboda et al. | 51—176 |
| 2,850,970 | 9/1958 | Brodie | 101—415.1 |
| 2,965,025 | 12/1960 | Mueller | 101—415.1 |
| 3,010,394 | 11/1961 | Borchers et al. | 101—395 |
| 3,043,219 | 7/1962 | Dietrich | 101—415.1 X |

ROBERT E. PULFREY, *Primary Examiner.*

ROBERT A. LEIGHEY, *Examiner.*